US012500119B2

(12) United States Patent
Deng et al.

(10) Patent No.: US 12,500,119 B2
(45) Date of Patent: Dec. 16, 2025

(54) AIR GAP WITH INVERTED T-SHAPED LOWER PORTION EXTENDING THROUGH AT LEAST ONE METAL LAYER, AND RELATED METHOD

(71) Applicant: GlobalFoundries Singapore Pte. Ltd., Singapore (SG)

(72) Inventors: Wensheng Deng, Singapore (SG); Kemao Lin, Singapore (SG); Curtis Chun-I Hsieh, Singapore (SG); Wanbing Yi, Singapore (SG); Liu Xinfu, Singapore (SG); Rui Tze Toh, Singapore (SG); Yanxia Shao, Singapore (SG); Shucheng Yin, Singapore (SG); Jason Kin Wei Wong, Singapore (SG); Yung Fu Chong, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 774 days.

(21) Appl. No.: 17/807,905

(22) Filed: Jun. 21, 2022

(65) Prior Publication Data
US 2023/0411208 A1 Dec. 21, 2023

(51) Int. Cl.
*H01L 21/768* (2006.01)
*H01L 23/522* (2006.01)
*H01L 23/532* (2006.01)

(52) U.S. Cl.
CPC ...... *H01L 21/7682* (2013.01); *H01L 23/5226* (2013.01); *H01L 21/76829* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 5,641,712 A | 6/1997 | Grivna et al. | |
| 5,914,519 A | 6/1999 | Chou et al. | |
| 6,165,890 A | 12/2000 | Kohl et al. | |
| 6,190,988 B1 | 2/2001 | Furukawa et al. | |
| 6,211,561 B1 | 4/2001 | Zhao | |
| 6,316,347 B1 | 11/2001 | Chang et al. | |
| 6,917,109 B2 | 7/2005 | Lur et al. | |
| 6,984,577 B1 | 1/2006 | Zhao et al. | |
| 7,138,329 B2 | 11/2006 | Lur et al. | |

(Continued)

FOREIGN PATENT DOCUMENTS

| | | |
|---|---|---|
| DE | 4239319 A1 | 4/1993 |
| DE | 4333875 A1 | 4/1995 |

(Continued)

*Primary Examiner* — Sue A Purvis
*Assistant Examiner* — Jordan M Klein
(74) *Attorney, Agent, or Firm* — Francois Pagette; Hoffman Warnick LLC (57) ABSTRACT

Methods of forming semiconductor devices including an air gap extending through at least one metal layer, and the semiconductor device so formed, are disclosed. The air gap has a lower portion that contacts a silicide layer over a gate body of a transistor gate and has an inverted T-shape over the gate body. The air gap reduces the capacitance between a transistor gate in a device layer and adjacent wires and vias used to contact the source and drain of the transistor.

20 Claims, 8 Drawing Sheets

(56) References Cited

U.S. PATENT DOCUMENTS

| | | |
|---|---|---|
| 7,449,407 B2 | 11/2008 | Lur et al. |
| 7,553,756 B2 | 6/2009 | Hayashi et al. |
| 7,790,601 B1 | 9/2010 | Choi et al. |
| 8,232,618 B2 | 7/2012 | Breyta et al. |
| 8,232,653 B2 | 7/2012 | Lee |
| 8,298,911 B2 | 10/2012 | Lee |
| 8,350,300 B2 | 1/2013 | Aoki |
| 9,653,348 B1 | 5/2017 | Wu et al. |
| 9,659,865 B2 | 5/2017 | Saka et al. |
| 10,157,777 B2 | 12/2018 | He et al. |
| 10,157,778 B2 | 12/2018 | Tsai et al. |
| 10,171,007 B2 | 1/2019 | Verheijden et al. |
| 10,211,146 B2 | 2/2019 | He et al. |
| 10,361,152 B2 | 7/2019 | Su et al. |
| 10,707,120 B1 | 7/2020 | Yami et al. |
| 11,011,414 B2 | 5/2021 | Lin |
| 11,127,678 B2 | 9/2021 | McGahay et al. |
| 11,244,857 B2 | 2/2022 | Tsai et al. |
| 2004/0097013 A1 | 5/2004 | Lur et al. |
| 2008/0020488 A1 | 1/2008 | Clevenger et al. |
| 2008/0308898 A1 | 12/2008 | Gabric et al. |
| 2009/0200636 A1 | 8/2009 | Edelstein et al. |
| 2010/0301489 A1 | 12/2010 | Seidel et al. |
| 2011/0018091 A1 | 1/2011 | Barth et al. |
| 2011/0193230 A1 | 8/2011 | Nogami et al. |
| 2012/0037962 A1 | 2/2012 | Breyta et al. |
| 2012/0058639 A1 | 3/2012 | Sim et al. |
| 2012/0235882 A1 | 9/2012 | Iverson et al. |
| 2015/0243544 A1 | 8/2015 | Alptekin et al. |
| 2015/0262929 A1 | 9/2015 | Hsiao et al. |
| 2016/0133508 A1 | 5/2016 | Gates et al. |
| 2016/0141240 A1 | 5/2016 | Saka et al. |
| 2016/0163816 A1 | 6/2016 | Yu et al. |
| 2017/0330790 A1* | 11/2017 | He .................. H01L 23/66 |
| 2017/0330832 A1* | 11/2017 | He .................. H01L 23/4821 |
| 2019/0096742 A1 | 3/2019 | Tsai et al. |
| 2019/0206718 A1 | 7/2019 | LiCausi et al. |
| 2020/0020568 A1 | 1/2020 | Lin |
| 2020/0105928 A1 | 4/2020 | Lee et al. |
| 2020/0152736 A1 | 5/2020 | Yu et al. |
| 2021/0175166 A1* | 6/2021 | McGahay ........... H10D 62/115 |
| 2022/0359706 A1* | 11/2022 | Futatsuki ........... H01L 21/7682 |

FOREIGN PATENT DOCUMENTS

| | | |
|---|---|---|
| DE | 102020129523 A1 | 6/2021 |
| DE | 102020111378 A1 | 10/2021 |
| DE | 112020002933 T5 | 2/2022 |

\* cited by examiner

AIR GAP WITH INVERTED T-SHAPED LOWER PORTION EXTENDING THROUGH AT LEAST ONE METAL LAYER, AND RELATED METHOD

BACKGROUND

Technical Field

The present disclosure relates to semiconductor devices, and more specifically, to a semiconductor device including an air gap extending through at least one metal layer and having an inverted T-shaped lower portion in contact with a silicide layer over a gate body of a transistor gate.

Related Art

Radio frequency (RF) switches are widely used in telecommunications equipment such as smartphones to route high frequency telecommunications signals through transmission paths. For instance, RF switches are commonly used in smartphones to allow use with different digital wireless technology standards used in different geographies. Current RF switches are generally fabricated using semiconductor-on-insulator (SOI) substrates. One challenge with RF switches formed in SOI substrates is controlling two competing parameters: on-resistance ($R_{on}$) which is the resistance of the switch when power is switched on, and off-state capacitance ($C_{off}$) which indicates the amount of cross-talk or noise that may occur within the system, i.e., the amount transmitted signals on one circuit creates an undesired effect on another circuit. $R_{on}$ is preferred to be as low as possible when the RF switch is on to reduce the power consumption, and $C_{off}$ should be minimized to reduce undesired coupling noise. In conventional semiconductor manufacturing processes, lowering either $R_{on}$ or $C_{off}$ if results in the opposite effect in the other parameter.

SUMMARY

A first aspect of the disclosure is directed to a semiconductor device, comprising: a device layer including a transistor gate having a silicide layer over a gate body; at least one metal layer over the device layer, the at least one metal layer including a dielectric with a conductor therein; and an air gap extending through the dielectric of the at least one metal layer, wherein a lower portion of the air gap contacts the silicide layer over the gate body and has an inverted T-shape over the gate body.

A second aspect of the disclosure includes a radio frequency semiconductor-on-insulator (RFSOI) switch, comprising: a transistor gate in a semiconductor-on-insulator (SOI) device layer of an SOI substrate, the transistor gate includes a silicide layer over a gate body; at least one metal layer over the SOI device layer, the at least one metal layer including a dielectric with a conductor therein; and an air gap extending through the dielectric of the at least one metal layer, wherein a lower portion of the air gap contacts the silicide layer over the gate body and has an inverted T-shape over the gate body.

A third aspect of the disclosure related to a method, comprising: forming an opening through a dielectric of at least one metal layer over a transistor gate, the opening exposing an etch stop layer (ESL) over a silicide layer over a gate body of the transistor gate; enlarging the opening over the transistor gate to remove the ESL and expose the silicide layer over the transistor gate, the enlarging of the opening undercutting the dielectric over the transistor gate; and forming an air gap by forming a dielectric layer over the opening to seal the opening, wherein a lower portion of the air gap contacts the silicide layer over the gate body and has an inverted T-shape over the gate body.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The present disclosure relates to methods of forming semiconductor devices including an air gap extending through at least one metal layer, and the semiconductor device so formed. Embodiments of the disclosure employ an air gap extending through the dielectric of at least one metal layer. The air gap has a lower portion that contacts a silicide layer over a gate body of the transistor gate and has an inverted T-shape over the gate body. The air gap reduces the capacitance between a transistor gate in a device layer and adjacent wires and vias used to contact the source and drain of the transistor. This capacitance reduction may decrease the off-state capacitance of the transistor when it is used in in applications such as radio frequency (RF) switches in semiconductor-on-insulator (SOI) substrates or bulk (non-SOI) substrates. Use of an air gap extending through two or more metal layers over a transistor gate provides a mechanism to reduce off-capacitance of any device using it by controlling one of the main contributors of intrinsic field effect transistor (FET) capacitance: the effective dielectric constant of the contact or device layer, and at least the first metal layer.

While the teachings of the disclosure will be described with regard to an SOI substrate and relative to an RF switch, it will be understood that the embodiments can be applied to various alternative semiconductor devices such as but not limited to low noise amplifiers (LNA) and power amplifiers. Further, the teachings may be applied to different substrates, such as a bulk substrate.

Figure 1:
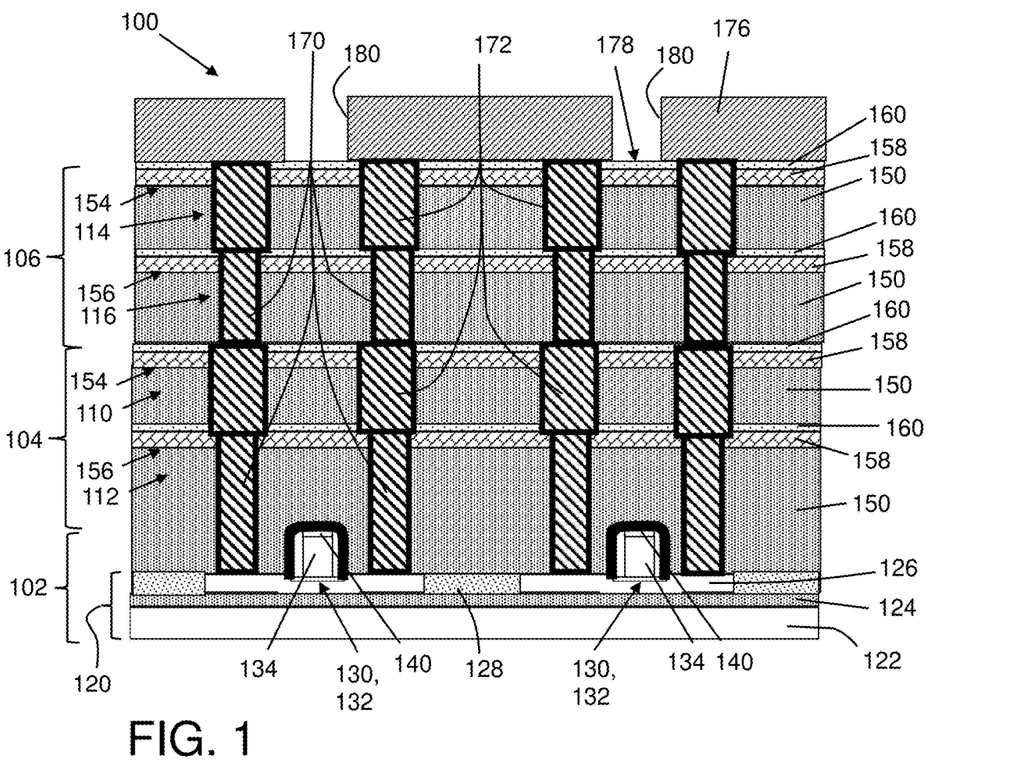
FIG. 1 shows a cross-sectional view of embodiments of an initial structure for a method according to the disclosure.

Referring to FIG. 1, a cross-sectional view of a first process of a method of forming an air gap for a semiconductor device according to embodiments of the disclosure is illustrated. FIG. 1 shows a semiconductor device 100 after formation of a device layer 102, a first interconnect layer 104 and a second interconnect layer 106. First interconnect layer 104 includes a first metal layer 110 (M1) and a first via layer 112 (V0 layer), and second interconnect layer 106 includes a second metal layer 114 (M2) and a second via layer 116 (V1). The teachings of the disclosure may also be applied to devices with more interconnect layers. Device layer 102 is illustrated as including a semiconductor-on-insulator (SOI) substrate 120 including a semiconductor substrate 122 with an insulator layer 124 thereover and a semiconductor-on-insulator (SOI) layer 126 thereover. Substrate 122 and SOI layer 126 may include any semiconductor material including but not limited to silicon, germanium, silicon germanium, and silicon carbide. Furthermore, a portion or entire semiconductor substrate 122 and/or SOI layer 126 may be strained. For example, SOI layer 126 may be strained. SOI layer 126 may be segmented by shallow trench isolations (STI) 128. Insulator layer 124 may include any appropriate dielectric material for the application desired, e.g., silicon oxide ($SiO_x$) or (less commonly) sapphire. Insulator layer 124 and/or STI 128 may also include the same material, such as silicon dioxide or any other interlayer dielectric material described herein.

Figure 2:
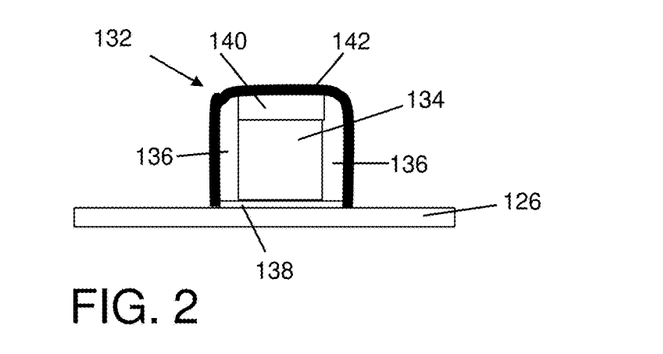
FIG. 2 shows an enlarged cross-sectional view of an illustrative transistor gate.

Device layer 102 also includes a number of transistors 130 formed therein. Each transistor 130 may include any now known or later developed transistor structure such as doped source/drain regions (not labeled) in SOI layer 126 having a transistor gate 132 thereover and therebetween. FIG. 2 shows an enlarged cross-sectional view of an illustrative transistor gate 132. Each transistor gate 132 may include, among other structures, a gate body 134 of polysilicon or a metal (commonly referred to collectively as "PC"), spacers 136 about gate body 134, a gate dielectric 138 under gate body 134, a silicide layer 140 over gate body 134 (i.e., a silicon-metal alloy), and an etch stop layer 142 over silicide layer 140 and/or spacers 136. Spacers 136 may include any now known or later developed spacer material such as silicon nitride ($Si_3N_4$), and gate dielectric 138 may include any now known or later developed gate dielectric material such as: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Etch stop layer 142 may include any now known or later developed etch stop material, such as silicon nitride, capable of etching as described herein. Silicide layer 140 may include any now known or later developed silicide material, e.g., titanium, nickel, cobalt, etc. As understood, each transistor gate 132 may run into, out of, or across the page as illustrated.

Returning to FIG. 1, each metal layer 110, 114 and via layer 112, 116 may include a dielectric 150. Dielectric 150 may include any now known or later developed interlayer dielectric (ILD) material having an etch rate in diluted hydrofluoric acid (DHF) less than silicon nitride. In one non-limiting example, dielectrics 150 include an undoped silica glass such as a tetraethyl orthosilicate (TEOS) silicon oxide. Each metal layer 110, 114 may include a respective metal cap layer 154 at an upper surface thereof. Similarly, each via layer 112 may include a respective via cap layer 156 at an upper surface thereof. Each cap layer 154, 156 may include one or more layers of, for example, a silicon oxide layer 158 and an etch stop layer 160, formed from silicon nitride (nitride), silicon carbon nitride (SiCN), etc., as known in the art. As understood, various other forms of cap layers may also be employed. Further, it is emphasized that while cap layers 154, 156 are illustrated as identical, they can be different materials, thicknesses, etc.

A number of conductors in the form of contacts 170 may extend through dielectrics 150 of via layers 112, 116 to various parts of device layer 102 and/or underlying metal layers, e.g., first metal layer 110. In the example shown, contacts 170 in first via layer 112 extend to source/drain regions of transistors 130. As understood, each contact 170 may include a conductor such as aluminum or copper, within a refractory metal liner of ruthenium; however, other refractory metals such as tantalum (Ta), titanium (Ti), tungsten (W), iridium (Jr), rhodium (Rh) and platinum (Pt), etc., or mixtures of thereof, may also be employed. Typically, contacts 170 extend mostly vertically within semiconductor device 100 to connect conductors in layers thereof, i.e., vertically on page as illustrated. Each metal layer 110, 114 may include a number of conductors in the form of metal wires 172 therein. Each metal wire 172 may use the same materials as listed for contacts 170. In contrast to contacts 170, metal wires 172 extend mostly horizontally or laterally in a layer within semiconductor device 100 to connect contacts 170 therein, i.e., into, out of, or across a page as illustrated. In this manner, first metal layer 110 may include a metal wire 172 extending into or out of the page and perhaps laterally parallel to transistor gate 132 in device layer 102. Similarly, second metal layer 114 may include a metal wire 172 extending into or out of the page and perhaps laterally across the page to connect contacts in second via layer 116.

Semiconductor device 100 as illustrated in FIG. 1 can be formed using any now known or later developed semiconductor fabrication techniques, e.g., material deposition, photolithographic patterning and etching, doping, etc. Although contacts 170 and wires 172 are shown in FIG. 1 as single damascene levels, they could be formed using dual damascene levels containing refractory metal lined copper or tungsten, as known in the art. While two interconnect layers 104, 106 each with a respective metal layer 110, 114 are illustrated, it will be readily understood that the teachings of the disclosure are applicable to any number of interconnect layers and metal layers.

"Depositing" or "deposition," as used herein, may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows forming an air gap mask 176 exposing a portion 178 of an uppermost metal layer which, as shown, includes second metal layer 114 (i.e., metal cap layer 154 thereof) of second interconnect layer 106. Second metal layer 114 is over second via layer 116 of second interconnect layer 106, which is over first metal layer 110 over first via layer 112 of first interconnect layer 104, which is over device layer 102. Mask 176 may be formed, for example, after second metal layer 114 damascene planarization, e.g., via chemical mechanical polishing (CMP), and may include any now known or later developed masking material. Mask 176 is patterned and etched in a conventional fashion to create openings 180 therein. In one embodiment, transistor gate 132 width is approximately 200 nanometers (nm) and openings 180 in air gap mask 176 may have a size of approximately 160 nm to 240 nm, and in particular, 200 nm. These widths could scale with larger and smaller channel transistor width or with larger or smaller contact 170 and wire 172 width.

Figure 3:
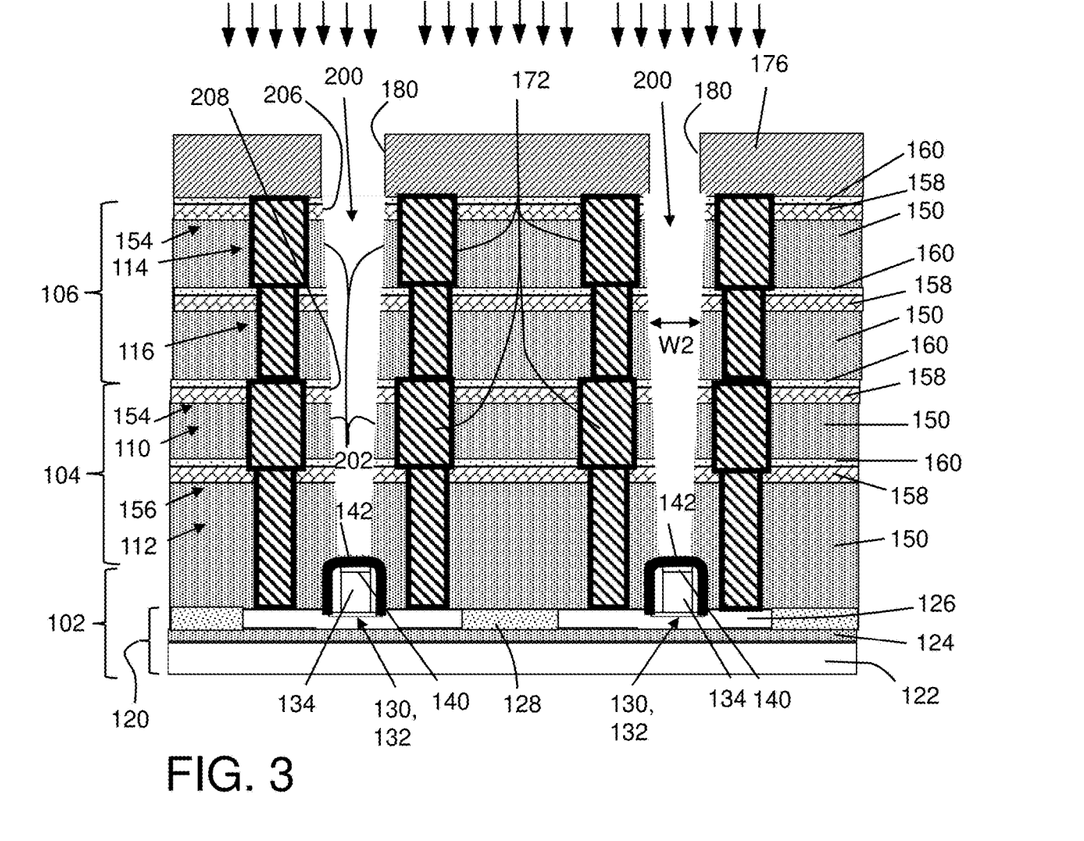
FIG. 3 shows a cross-sectional view of etching an opening for an air gap over a transistor gate, according to embodiments of a method of the disclosure.
Figure 8:
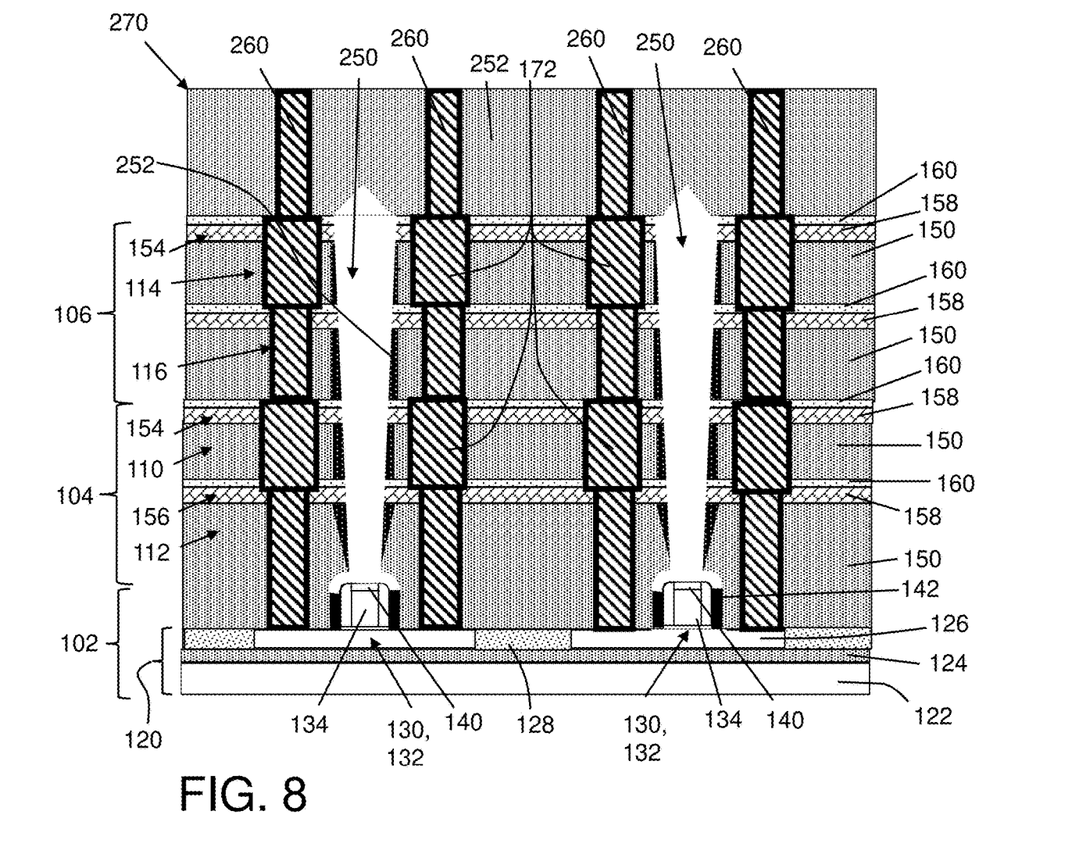
FIG. 8 shows a cross-sectional view of forming an air gap and a semiconductor device, such as a radio frequency SOI switch, including the air gap, according to other embodiments of the disclosure.
Figure 9:
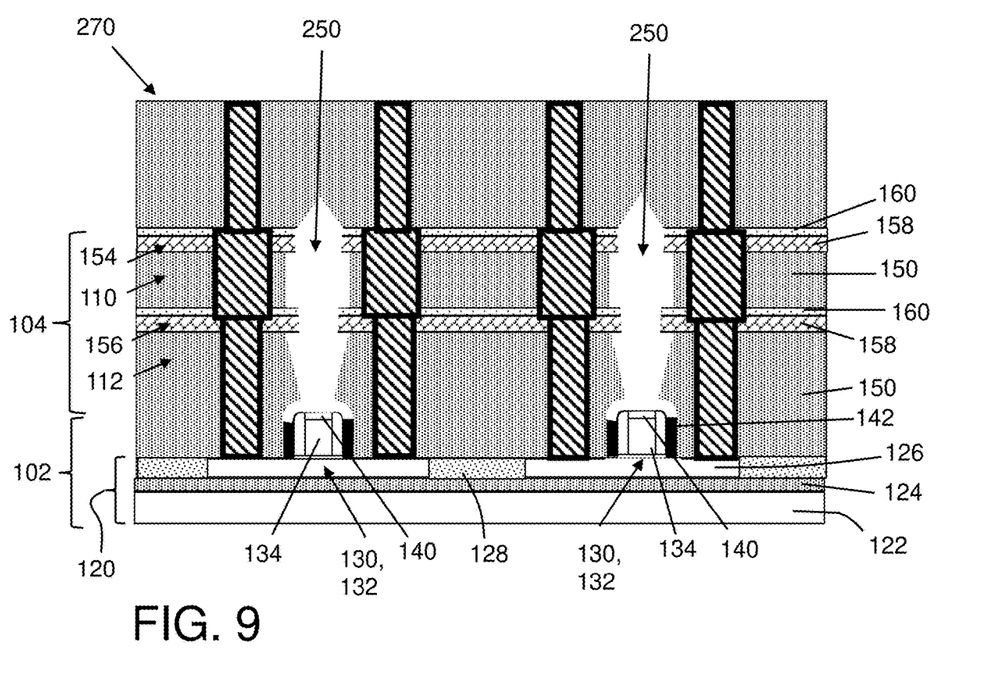
FIG. 9 shows a cross-sectional view of forming an air gap and a semiconductor device including the air gap, according to alternative embodiments of the disclosure.

FIG. 3 shows a cross-sectional view of forming an opening 200 through dielectric 150 of at least one metal layer over transistor gate 132 in device layer 102 of a semiconductor structure. (For purposes of description, two metal layers 110, 114 are shown, but one or more than two are possible. FIG. 9 shows a device including air gap 250 in one metal layer 110.) Opening 200 can be formed by etching opening 200 through second interconnect layer 106, through at least first metal layer 110 of first interconnect layer 104 and part of first via layer 112, using air gap mask 176. Opening 200 formation generates a multi-layer opening with a single etching process rather than a two-step process, and results in a more consistent center-to-edge width. Opening 200 exposes sidewalls 202 of dielectrics 150 of interconnect layers 104, 106 including those of first and second metal layers 110, 114 and second via layer 116 and part of first via layer 112. Etching generally refers to the removal of material from a substrate (or structures formed on the substrate) and is often performed with a mask in place so that material may be selectively removed from certain areas of the substrate, while leaving the material unaffected, in other areas of the substrate. There are generally two categories of etching, (i) wet etch, and (ii) dry etch. Wet etch is performed with a solvent (such as an acid or a base) which may be chosen for its ability to selectively dissolve a given material (such as oxide), while leaving another material (such as polysilicon or nitride) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotopic. Ion milling, or sputter etching, bombards the wafer with energetic ions of noble gases which approach the wafer approximately from one direction, and therefore this process is highly anisotropic. Reactive ion etching (RIE) operates under conditions intermediate between sputter and plasma etching and may be used to produce deep, narrow features, such as STI trenches. In FIG. 3, the etching (indicated by arrows) may include a RIE. As used herein, "over the transistor gate" as it refers to opening 200 and/or any air gap 250 (FIGS. 6-8) formed therewith, means overlapping transistor gate 132 in any fashion.

As shown in FIG. 3, opening 200 may expose etch stop layer 142 over silicide layer 140 over gate body 134 of transistor gate 132. With regard to opening 200 depth, etching opening 200 may cease when opening 200 exposes etch stop layer 142. The etching of FIG. 3 can be controlled to select the extent of exposure of an upper surface of transistor gate 132. While two openings 200 are shown, any number of openings 200 can be formed over any number of transistor gates 132. Further, it will be recognized that openings 200 may take the form of trenches (e.g., into or out of the page, or across the page at different cross-sections of the device). In this manner, air gaps 250 (FIG. 6-7) formed according to embodiments of the disclosure can have a variety of different lateral layouts.

As shown in FIG. 3, forming opening 200 exposes an edge 206 of a first metal cap layer 154 over an uppermost metal layer (e.g., second metal layer 114) of the at least one metal layer 110, 114 and dielectric 150 under uppermost metal cap layer 114 at the upper portion of opening 200. Forming opening 200 can also expose an edge 208 of a second metal cap layer 154 over another metal layer (e.g., first metal layer 110) of the at least one metal layer 110, 114 that is under uppermost metal layer 114 and a dielectric 150 under second metal cap layer 154. Similarly, edges (not numbered) of via cap layers 156 may be exposed by forming of opening 200.

Figure 4:
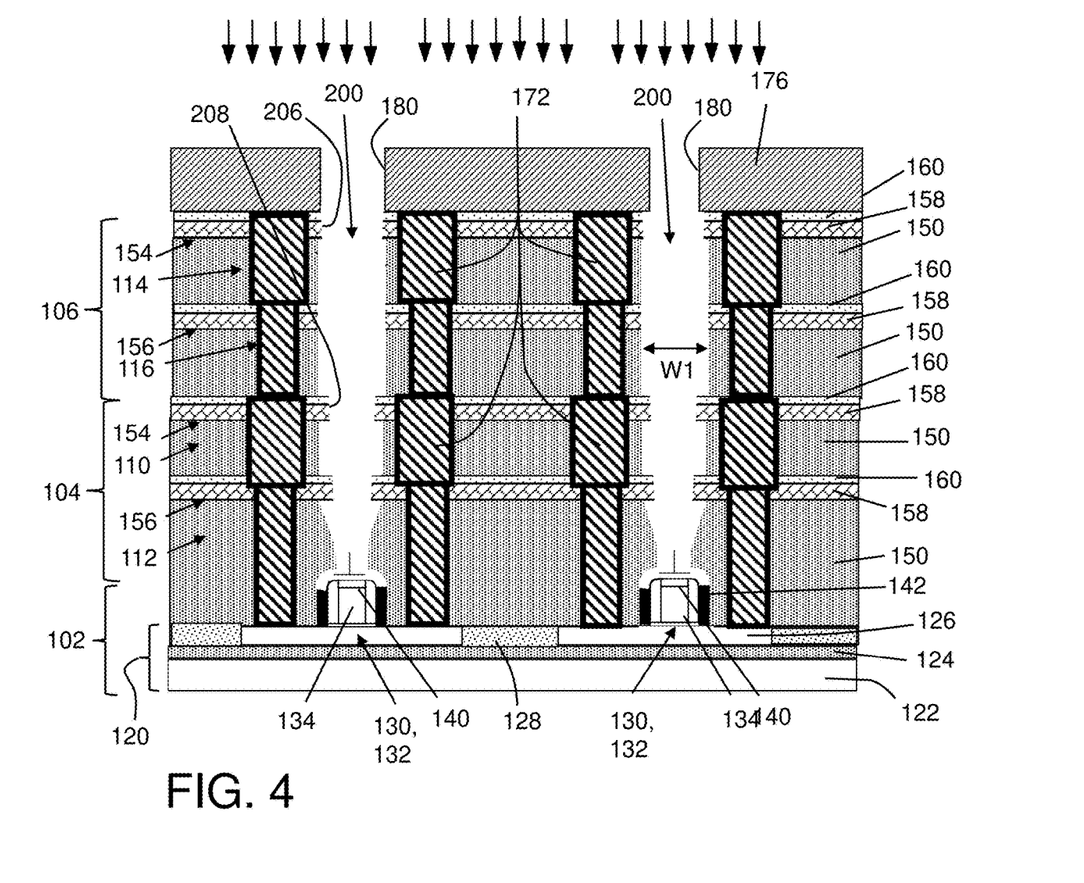
FIG. 4 shows a cross-sectional view of enlarging the opening and removing an etch stop layer over a silicide layer over a gate body of the transistor gate, according to embodiments of the method of the disclosure.
Figure 6:
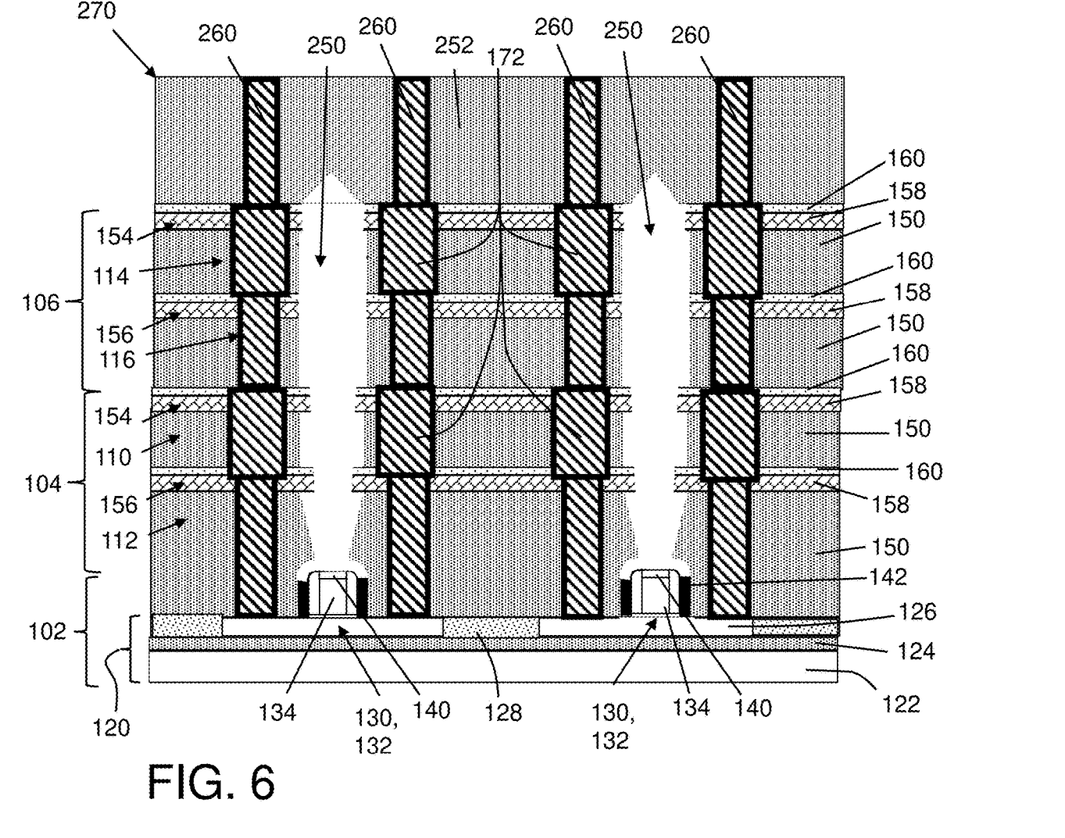
FIG. 6 shows a cross-sectional view of forming an air gap and a semiconductor device, such as a radio frequency SOI switch, including the air gap, according to embodiments of the disclosure.

At this stage of air gap formation, processing may include enlarging opening 200. FIG. 4 shows cross-sectional views of enlarging opening 200 over transistor gate 132 to remove etch stop layer 142 and expose silicide layer 140 over transistor gate 132, i.e., gate body 134. The enlarging undercuts dielectric 150 over transistor gate 132. In this manner, opening 200 (and eventually air gap 250 (FIGS. 6-8)) has a lower portion contacting silicide layer 140 over gate body 134 and has an inverted T-shape over gate body 134 (see indication of inverted T-shape in FIG. 4). The enlarging removes a portion of etch stop layer 142 over gate body 134, which reduces the effective dielectric constant thereof over gate body 134. The enlarging may also extend opening 200 to below an upper surface 220 of silicide layer 140 and may extend it along an upper portion of gate body 134. That is, opening 200 exposes sides of upper portion of gate body 134, e.g., spacers 136 thereof, and in or into contact with upper portion of gate body 134. Consequently, as shown in FIGS. 6 and 8, air gap 250 may also extend below upper surface 220 of silicide layer 140. The enlarging also exposes sidewalls 202 (FIG. 3) of dielectric 150 of interconnect layers 104, 106 in opening 200. Among other benefits, the enlarging of (width between) sidewalls acts to enlarge opening 200 and thus air gaps 250 (FIGS. 6-8), reducing the effective dielectric constant of interconnect layers 104, 106 while leaving the air gap top opening to be sealed in the next process step narrower than the air gap itself. If silicon oxide films, such a undoped silica glass (USG), are used for dielectrics 150 of metal layers 110, 114 and silicon nitride is used for cap layer(s) 154, 156, then a hydrofluoric acid (HF) wet etch could be used for this enlarging process (indicated by arrows in FIG. 4). In one embodiment this process may include performing any now known or later developed etch stop layer 142 treatment, e.g., a RIE clean or similar treatment, and exposing opening 200 to a wet etch, e.g., using a diluted hydrofluoric (DHF) acid etch. HF concentrations could be in the range of, for example, 10:1 to 500:1 dilution with water. Etch stop layer 142 of, for example, ultraviolet silicon nitride, etches faster than dielectrics 150 of, for example, USG.

In addition, because dielectrics 150 etch faster than the dielectric(s) of cap layer(s) 154, 156, FIG. 4 shows that opening 200 width W1, for example, is wider than width W2 (FIG. 3) at the same location prior to enlarging. In one embodiment, shown in FIG. 4, recessing exposed sidewalls 202 (FIG. 3) of dielectrics 150 of interconnect layers 104, 106 in opening 200 may expose edges 206, 208 of at least one of metal cap layer 154 of first metal layer 110 (if not already exposed) as shown. In some cases, the recessing may expose edges of via cap layers 156 of one or more of via layers 112, 116. The enlarging process may also extend opening 200 to be adjacent edge(s) 206, 208 of at least one cap layer 154, 156 of metal layer(s) 110, 114, i.e., opening 200 is adjacent to, over and under edges 206, 208. That is, once formed, air gap 250 (FIGS. 6-8) is adjacent to edge(s) 206, 208 of cap layer(s) 154, 156 over metal layer(s) 110, 114. In certain embodiments, air gap 250 (FIGS. 6-8) surrounds edge(s) 206, 208 of cap layer(s) 154, 156 over metal layer(s) 110, 114. As noted, the etching removes etch stop layer 140 over silicide layer 140 over gate body 134. In one non-limiting example, opening 200 may have an average width of 160 nm, i.e., within 135-185 nm, after the enlarging.

Figure 5:
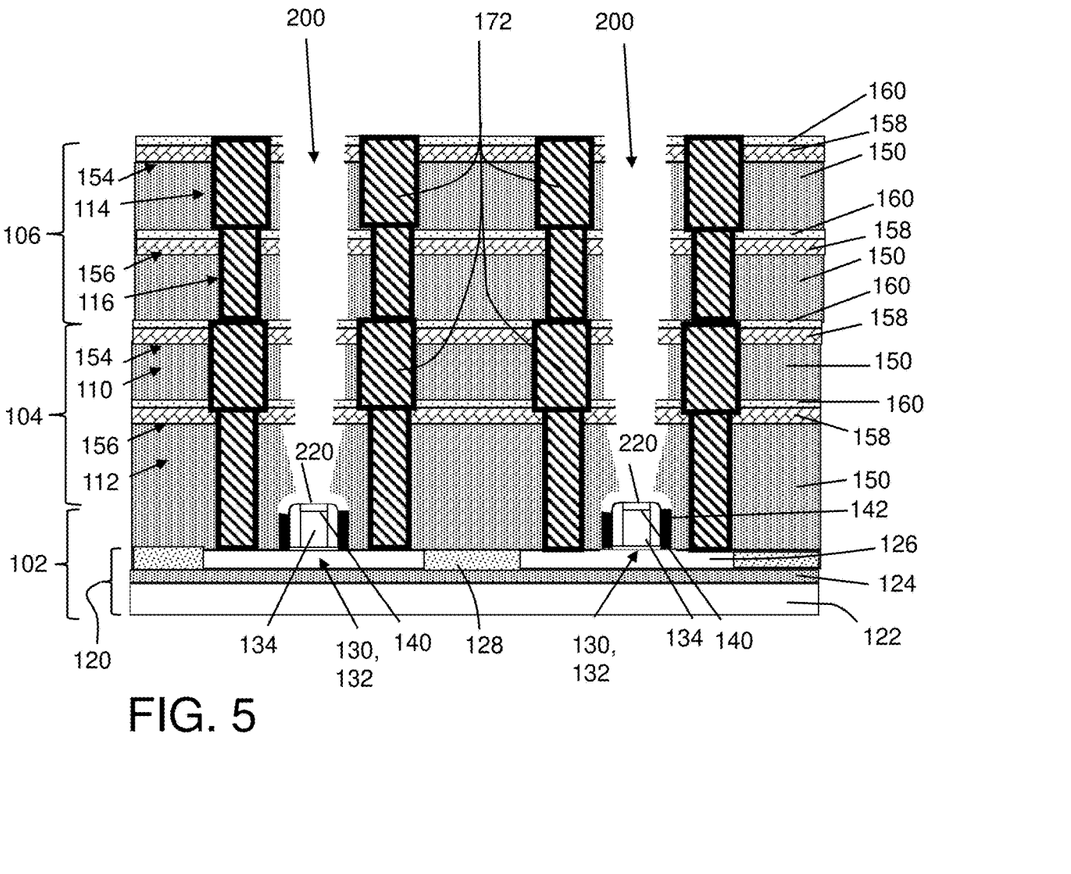
FIG. 5 shows a cross-sectional view of removing an air gap forming mask, according to embodiments of the disclosure.

FIG. 5 shows a cross-sectional view of the semiconductor device after removing air gap mask 176. Air gap mask 176 (FIGS. 1, 3 and 4) may be removed using any now known or later developed resist strip, in-situ or ex-situ.

FIG. 6 shows a cross-sectional view of forming an air gap 250 (through at least one metal layer 110, 114) by forming a dielectric layer 252 over opening 200 to seal opening 200. A lower portion of air gap 250 contacts silicide layer 140 over gate body 134 and has an inverted T-shape over gate body 134. Air gap 250 also extends below upper surface 220 of silicide layer 140, e.g., sides of the T-shape curl around silicide layer 140, spacers 136 and gate body 134. Gate body 134 remains covered by silicide layer 140 and spacers 136. Air gap 250 is formed over transistor gate 132 by depositing dielectric layer 252, the latter of which acts as an air gap capping layer to seal opening 200 at a surface of uppermost metal layer 114. As shown in FIG. 8, this process may also line a sidewall 202 (FIG. 3) of dielectrics 150 of metal layers 110, 114 with dielectric layer 252 (shaded slightly darker for clarity), i.e., narrowing air gap 250 slightly. Although not shown, edges 206, 208 of cap layers 154 of metal layers 110, 114 and edges (not numbered) of via layers 112, 116, may also be covered. Sidewalls 202 (FIG. 3) of dielectrics 150 may be lined where, for example, dielectric layer 252 is capable of entering opening 200 during formation and/or opening 200 is wide enough to allow dielectric layer 252 to enter prior to sealing the opening.

As shown, air gap 250 is vertically aligned with transistor gate 132, although perfect alignment is not necessary in all cases. Dielectric layer 252 may include any dielectric material capable of sealing opening 200 and acting as an interlayer dielectric (ILD) for a next via layer to be formed therein. In one embodiment, dielectric layer 252 may include chemical vapor deposited (CVD) dielectric. In another embodiment, dielectric layer 252 may include a plasma-enhanced chemical vapor deposition (PECVD) silane oxide. PECVD silane oxide may be chosen because it has very poor step coverage, resulting in a larger air gap volume. In other embodiments, dielectric layer 252 may include a thin silicon nitride layer with an ILD oxide, such as a PECVD TEOS-based, PVD, or similar oxide (individual layers not shown for clarity). Dielectric layer 252 may include more than one layer of interlayer dielectric material. Air gap 250 does not expose any contact 170 or metal wire 172 within dielectrics 150 of interconnect layers 104, 106. That is, dielectric 150 or any lining of dielectrics 150 by dielectric layer 252 covers any conductive wire 172 in first metal layer 110 and second metal layer 114 or any conductive contact 170 in first via layer 112 and second via layer 116.

As shown in FIG. 6, air gap 250 extends vertically across at least one metal layer 110, 114. More particularly, air gap 250 extends vertically above and below metal wires 172 in first metal layer 110 and second metal layer 114, i.e., below dielectric 150 of first metal layer 110 and above metal wire 172 in second metal layer 114. Air gap 250 also extends above an upper surface of second metal layer 114. As also shown in FIG. 6, air gap 250 may vertically contact silicide layer 140 of transistor gate 132, i.e., silicide layer 140 may be exposed in air gap 250. Air gap 250 may surround edges 206, 208 of cap layer 154 of metal layers 110, 114 (and unlabeled edges of cap layer 156 of via layers 112, 116). Air gap 250 extends only partially into dielectric layer 252 that caps the air gap, so that dielectric layer 252 can act as a dielectric for a third via layer with minimal interference from air gap 250. Vias 260 in dielectric layer 252 can extend to another metal layer (not shown) that may be formed in dielectric layer 252 or a dielectric layer thereover, using any conventional or later developed technique. Dielectric layer 252 seals opening 200 (FIG. 6) regardless of the lateral layout. The lateral formation of opening 200 can be controlled to avoid exposure thereof by subsequently formed vias 260, thus preventing the conductor of via 260 from entering air gap 250.

Figure 7:
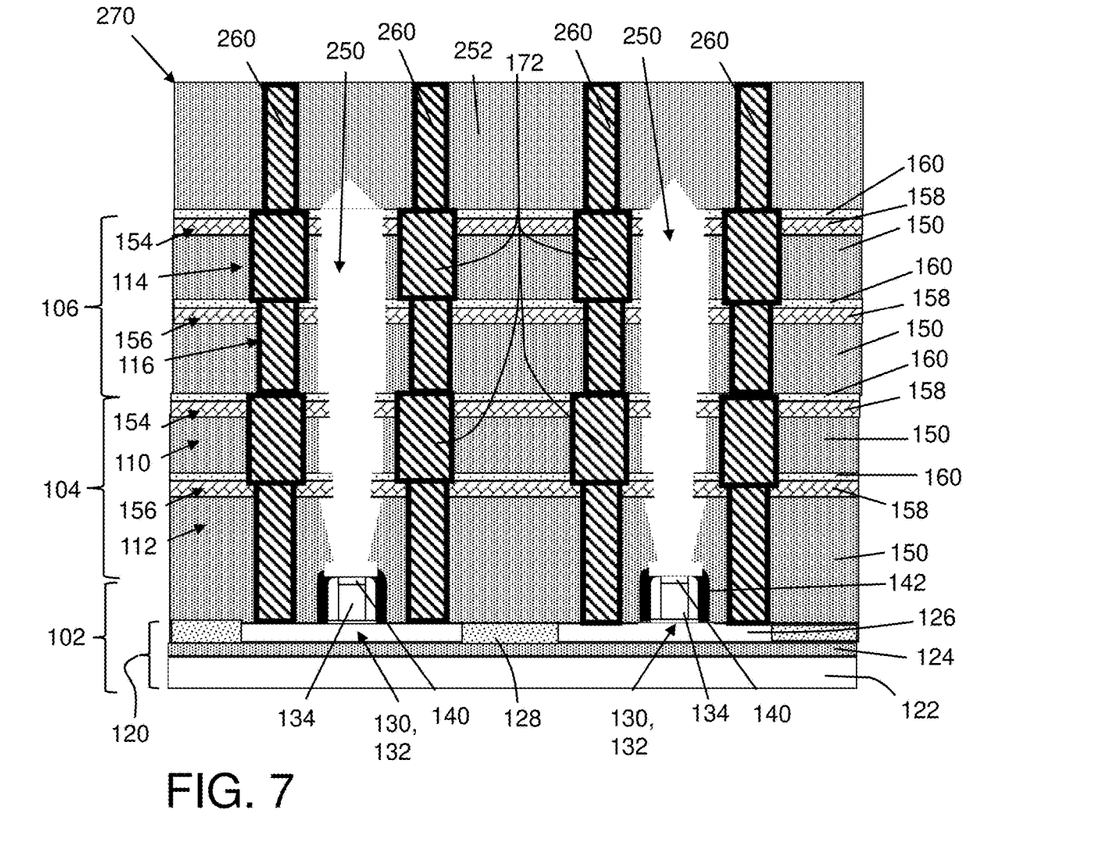
FIG. 7 shows a cross-sectional view of forming an air gap and a semiconductor device, such as a radio frequency SOI switch, including the air gap, according to other embodiments of the disclosure.

Referring to FIGS. 6 and 7, a semiconductor device 270 according to embodiments of the disclosure is also shown. In one embodiment, semiconductor device 270 may include device layer 102 including transistor gate 132 having silicide layer 140 over gate body 134. Etch stop layer 142 is removed from at least part of silicide layer 140, e.g., where air gap 250 is present. Transistor 130 can take the form of any now known or later developed complementary metal-oxide semiconductor (CMOS) field effect transistor (FET). Semiconductor device 270 can also include at least one metal layer 110, 114 over device layer 102. Metal layers 110, 114 may be part of interconnect layers 104, 106, respectively, over device layer 102. First interconnect layer 104 may include one or more interconnect layers including, for example, first via layer 112 and first metal layer 110; and second interconnect layer 106 may include one or more interconnect layers including, for example, second via layer 116 and second metal layer 114. That is, first metal layer 110 is part of first interconnect layer 104 which also includes first via layer 112, and second metal layer 114 is part of second interconnect layer 106 which also includes second via layer 116. In any event, metal layers 110, 114 include dielectric 150 with conductor (e.g., wires 172) therein.

Semiconductor device 270 also includes air gap 250 extending through dielectric 150 of the at least one metal layer 110, 114. Air gap 250 is contiguous through the at least one metal layer 110, 114, i.e., there is no break in the air gap. The at least one metal layer may include at least a first metal layer 110 over device layer 102 and second metal layer 114 over first metal layer 110. Air gap 250 may extend through any number of additional metal layers, e.g., a third, fourth, fifth metal layer, etc., and any intervening via layers. Air gap 250 may extend through second via layer 116 and part of first via layer 112. Air gap 250 is over transistor gate 132 in device layer 102 below a lowermost metal layer, e.g., first metal layer 110 of the at least one metal layer. A lower portion of air gap 250 contacts silicide layer 140 over gate body 134 and has an inverted T-shape over gate body 134. As shown in FIGS. 6 and 8, air gap 250 may also extend below upper surface 220 of silicide layer 140, e.g., sides of the T-shape curl around silicide layer 140, spacers 136 and gate body 134. Thus, air gap 250 may extend adjacent an upper portion of gate body 134, i.e., it is to the side of some of an upper portion of gate body 134. As shown in FIG. 7, a lower portion of air gap 250 may contact silicide layer 140 over gate body 134 and have the inverted T-shape over gate body 134, but not extend below an upper surface of silicide layer 140 or along an upper portion of gate body 134. In any event, gate body 134 remains covered by silicide layer 140 and spacers 136. Dielectric layer 252 seals air gap 250 and, as shown in FIG. 8, may line sidewall 202 (FIG. 3) of dielectric 150 of at least one metal layer 110, 114.

Semiconductor device 270 may also include at least one cap layer 154 over each metal layer 110, 114. Metal cap layer 154 of an uppermost metal layer (e.g., second metal layer 114) is over dielectric 150 of second metal layer 114, and metal cap layer 154 of second metal layer 114 is over dielectric 150 of first metal layer 110 (with second via layer 116 therebetween). Air gap 250 may surround edge(s) 206, 208 of cap layer(s) 154 over each metal layer 110, 114 (and unlabeled edges of cap layer 156 of via layers 112, 116). That is, air gap 250 is adjacent to, over and under the edges.

Air gap 250 includes dielectric layer 252 sealing an upper end of the air gap. Note, as shown in FIG. 8, a film layer from dielectric 252 formation (not shown) may narrow width from that present after the enlarging. In one embodiment, air gap 250 may have a height-to-width ratio greater than approximately 6.5. Other dimensions and/or dimensional ratios are also possible. Although not shown, air gap 250 may be laterally elongated into and out of the page and may have any desired lateral layout.

FIG. 9 shows a cross-sectional view of semiconductor device 270 including air gap 250 in one metal layer 110. While FIG. 9 shows air gap 250 in the form of the FIG. 6 embodiment, it will be recognized that it can have any of the formats described herein.

Any number of air gaps 250 can be provided with each air gap 250 extending through each of the at least one metal layer 110, 114, etc., and contacting silicide layer 140 above a respective gate body 134 of a transistor gate 132. Each air gap 250 has the inverted T-shape in contact with silicide layer 140 at a lower portion thereof.

As will be recognized, semiconductor device 270 can be used to form a variety of devices such as a radio frequency semiconductor-on-insulator (RFSOI) switch, a low amplitude amplifier, a power amplifier, etc. Use of air gap 250 over transistor gate 132 according to the various embodiments of the disclosure provides a mechanism to reduce off-capacitance and on-resistance of any device using it by controlling one of the main contributors of intrinsic FET capacitance: the effective dielectric constant of first via layer 112 and first metal layer 110.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconductor device, comprising:
    a device layer including a transistor gate having a silicide layer over a gate body;
    at least one metal layer over the device layer, the at least one metal layer including a dielectric with a conductor therein; and
    an air gap extending through the dielectric of the at least one metal layer, wherein a lower portion of the air gap within the dielectric contacts the silicide layer over the gate body, and the air gap includes a lowermost surface below the silicide layer interfacing with an upper surface of an etch stop layer adjacent the gate body, and has an inverted T-shape over the gate body.

2. The semiconductor device of claim 1, wherein the at least one metal layer includes at least a first metal layer over the device layer and a second metal layer over the first metal layer.

3. The semiconductor device of claim 1, further comprising at least one cap layer over each metal layer, wherein the air gap surrounds an edge of the at least one cap layer over each metal layer.

4. The semiconductor device of claim 1, wherein the at least one metal layer includes a first metal layer that is part of a first interconnect layer also including a first via layer, and a second metal layer that is part of a second interconnect layer also including a second via layer, wherein the air gap extends through the second via layer and part of the first via layer.

5. The semiconductor device of claim 1, further comprising a dielectric layer sealing the air gap, and lining a sidewall of the dielectric of the at least one metal layer.

6. The semiconductor device of claim 1, wherein the air gap extends below an upper surface of the silicide layer.

7. The semiconductor device of claim 6, wherein the air gap extends adjacent an upper portion of the gate body.

8. A radio frequency semiconductor-on-insulator (RFSOI) switch, comprising:
    a transistor gate in a semiconductor-on-insulator (SOI) device layer of an SOI substrate, the transistor gate includes a silicide layer over a gate body;
    at least one metal layer over the SOI device layer, the at least one metal layer including a dielectric with a conductor therein; and
    an air gap within the dielectric extending through the dielectric of the at least one metal layer, wherein a lower portion of the air gap contacts the silicide layer over the gate body, and the air gap includes a lowermost surface below the silicide layer interfacing with an upper surface of an etch stop layer adjacent the gate body, and has an inverted T-shape over the gate body.

9. The RFSOI switch of claim 8, wherein the at least one metal layer includes at least a first metal layer over the device layer and a second metal layer over the first metal layer.

10. The RFSOI switch of claim 8, further comprising at least one cap layer over each metal layer, wherein the air gap is adjacent to an edge of the at least one cap layer over each metal layer.

11. The RFSOI switch of claim 8, wherein the at least one metal layer includes a first metal layer that is part of a first interconnect layer also including a first via layer, and a second metal layer that is part of a second interconnect layer also including a second via layer, wherein the air gap extends through the second via layer and part of the first via layer.

12. The RFSOI switch of claim 8, further comprising a dielectric layer sealing the air gap, and lining a sidewall of the dielectric of the at least one metal layer.

13. The RFSOI switch of claim 8, wherein the air gap extends below an upper surface of the silicide layer.

14. The RFSOI switch of claim 13, wherein the air gap extends adjacent an upper portion of the gate body.

15. A method, comprising:
    forming an opening through a dielectric of at least one metal layer over a transistor gate, the opening exposing an etch stop layer (ESL) over a silicide layer over a gate body of the transistor
    enlarging the opening over the transistor gate to remove the ESL and expose the silicide layer over the transistor gate, the enlarging of the opening undercutting the dielectric over the transistor gate; and
    forming an air gap by forming a dielectric layer over the opening to seal the opening, wherein a lower portion of the air gap within the dielectric contacts the silicide layer over the gate body and the air gap includes a lower surface below the silicide layer interfacing with an upper surface of the etch stop layer adjacent the gate body, and has an inverted T-shape over the gate body.

16. The method of claim 15, wherein the forming the opening includes performing a reactive ion etch (RIE), and the enlarging includes treating the etch stop layer and exposing the opening to a diluted hydrofluoric (DHF) acid etch.

17. The method of claim 15, wherein the enlarging extends the opening to below an upper surface of the silicide layer and to extend along an upper portion of the gate body, and wherein the air gap extends below the upper surface of the silicide layer.

18. The method of claim 15, wherein the enlarging extends the opening to surround an edge of at least one cap layer over the at least one metal layer, and wherein the air gap adjacent to the edge of the at least one cap layer over the at least one metal layer.

19. The method of claim 15, wherein the at least one metal layer includes a first metal layer that is part of a first interconnect layer also including a first via layer, and a second metal layer that is part of a second interconnect layer also including a second via layer, wherein the air gap extends through the second via layer and part of the first via layer.

20. The method of claim 15, wherein the forming the air gap lines a sidewall of the dielectric of the at least one metal layer with the dielectric layer.

* * * * *